(12) United States Patent
Kim

(10) Patent No.: US 7,262,072 B2
(45) Date of Patent: Aug. 28, 2007

(54) CMOS IMAGE SENSOR AND METHOD FOR FABRICATING THE SAME

(75) Inventor: Duk Soo Kim, Metropolitan (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/315,157

(22) Filed: Dec. 23, 2005

(65) Prior Publication Data

US 2006/0138497 A1 Jun. 29, 2006

(30) Foreign Application Priority Data

Dec. 24, 2004 (KR) ........................ 10-2004-0112057

(51) Int. Cl.
*H01L 21/00* (2006.01)
(52) U.S. Cl. ............................. 438/57; 438/65; 438/70
(58) Field of Classification Search ................ 438/199, 438/57, 60, 65, 69, 70
See application file for complete search history.

(56) References Cited

U.S. PATENT DOCUMENTS

| | | | | |
|---|---|---|---|---|
| 5,321,297 A | * | 6/1994 | Enomoto | 257/432 |
| 6,831,311 B2 | * | 12/2004 | Uchida | 257/290 |
| 2005/0029643 A1 | * | 2/2005 | Koyanagi | 257/680 |

FOREIGN PATENT DOCUMENTS

| | | |
|---|---|---|
| JP | 05-048057 | 2/1993 |
| JP | 2003-204050 | 7/2003 |

* cited by examiner

*Primary Examiner*—Michael Trinh
(74) *Attorney, Agent, or Firm*—McKenna Long & Aldridge LLP

(57) ABSTRACT

A CMOS image sensor and a method for fabricating the same are disclosed, in which double microlenses are formed using materials having different refractive indexes to improve concentration efficiency of light, thereby improving the characteristics of the image sensor.

10 Claims, 4 Drawing Sheets

CMOS IMAGE SENSOR AND METHOD FOR FABRICATING THE SAME

CROSS REFERENCE TO RELATED APPLICATION

This application claims the benefit of the Korean Patent Application No. P2004-112057, filed on Dec. 24, 2004, which is hereby incorporated by reference as if fully set forth herein.

BACKGROUND OF THE INVENTION

1. Field of the Invention

The present invention relates to an image sensor, and more particularly, a complementary metal-oxide semiconductor (CMOS) image sensor and a method for fabricating the same in which condensing efficiency of light is maximized to improve characteristics of the image sensor.

2. Discussion of the Related Art

An image sensor is a semiconductor device that converts optical images to electrical signals. The image sensor is classified into a charge coupled device (CCD) image sensor and a CMOS image sensor.

The CMOS image sensor includes a photodiode area sensing light and a CMOS logic circuit area processing the sensed light to generate electrical signals. If light-receiving amount of the photodiode is great, the image sensor has excellent photosensitivity characteristics.

To enhance photosensitivity, it is necessary to increase a fill factor of an area occupied by the photodiode among the whole area of the image sensor. Alternatively, it is necessary to change a path of incident light to an area other than the photodiode so as to concentrate light to the photodiode.

To concentrate light to the photodiode, a microlens is generally used. A convex microlens made of material having good light transmittance is formed on the photodiode to refract a path of incident light, thereby irradiating more light to the photodiode.

Light parallel to a light axis of the microlens is refracted by the microlens so that a focal point is formed on a certain position of the light axis.

Hereinafter, a related art CMOS image sensor will be described with reference to the accompanying drawings.

FIG. 1 is a sectional view illustrating a related art CMOS image sensor.

As shown in FIG. 1, the related art CMOS image sensor includes at least one or more photodiodes 11 formed in a semiconductor substrate (not shown) to generate charges in response to incident light, an inter-dielectric layer 12 formed on an entire surface of the semiconductor substrate including the photodiodes 11, a passivation layer 13 formed on the inter-dielectric layer 12, R/G/B color filter layers 14 formed on the passivation layer 13 to respectively pass through light of specific wavelengths, a planarization layer 15 formed on the color filter layers 14, and a convex microlens 16 having a certain curvature formed on the planarization layer 15 to pass through the color filter layers 14, thereby concentrating light on the photodiodes 11.

Although not shown, the CMOS image sensor further includes a light-shielding layer in the inter-dielectric layer 12 to prevent light from entering a portion other than the photodiodes 11.

Instead of the photodiode, a photogate type device may be used as a device for sensing light.

The curvature and the height ('A' of FIG. 1) of the microlens 16 are determined considering various factors such as a focal point of concentrated light. A resin such as polymer is generally used as the microlens 16. The microlens 16 is formed by deposition, patterning and reflow processes.

The optimized size and thickness and the curvature radius of the microlens 16 should be determined by size, position and shape of a unit pixel, a thickness of the photodiode, and height, position and size of the light-shielding layer.

A photoresist is generally used as the microlens 16 whose curvature and height are determined considering various factors such as a focal point of concentrated light. The photoresist is coated and then patterned by exposing and developing processes to form a photoresist pattern. The photoresist pattern may be formed by a reflow process.

Meanwhile, a pattern profile is varied depending on focus of the photoresist.

For example, process conditions are varied depending on a condition of a sub-layer. Therefore, a profile of the microlens is varied.

In the process for fabricating the aforementioned related art CMOS image sensor, the microlens 16 formed to improve concentration efficiency of light serves as a main factor that determines characteristics of the image sensor.

The microlens 16 serves to condense more light to the photodiodes 11 through the respective color filter layers 14 depending on wavelengths of light when the light is irradiated.

The incident light to the image sensor is concentrated by the microlens 16 and filtered by the color filter layers 14. The light then enters the photodiodes 11 corresponding to the color filter layers 14.

The light-shielding layer serves to prevent the incident light from getting out of its path.

When the related art CMOS image sensor is fabricated, since the condition of the photoresist pattern is unstable, concentration efficiency of the light is deteriorated. This could deteriorate performance of the CMOS image sensor.

SUMMARY OF THE INVENTION

Accordingly, the present invention is directed to a CMOS image sensor and a method for fabricating the same that substantially obviates one or more problems due to limitations and disadvantages of the related art.

An advantage of the present invention is that it can provide a CMOS image sensor and a method for fabricating the same in which double microlenses are formed using materials having different refractive indexes to improve concentration efficiency of light, thereby improving characteristics of the image sensor.

Additional advantages and features of the invention will be set forth in part in the description which follows, and in part will become apparent from the description, or may be learned by practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a CMOS image sensor according to the present invention includes a plurality of photodiodes formed in a semiconductor substrate with a predetermined distance therebetween, an inter-dielectric layer formed on an entire surface of the semiconductor substrate including the photodiodes, color filter layers formed on the inter-dielectric layer with a predetermined distance therebetween, first microlenses formed over the color filter layers corresponding to the photodiodes, and second microlenses formed to surround the first microlenses, the second microlenses having a refractive index different from that of the first microlenses.

In another aspect of the present invention, a method for fabricating a CMOS image sensor includes forming an inter-dielectric layer on an entire surface of a semiconductor substrate in which a plurality of photodiodes are formed, forming color filter layers on the inter-dielectric layer with a predetermined distance therebetween, forming first microlenses having a first refractive index over the color filter layers to correspond to the photodiodes, and forming second microlenses having a second refractive index on the first microlenses in such a way that the second microlenses surround the first microlenses.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention.

In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or like parts.

Figure 1:
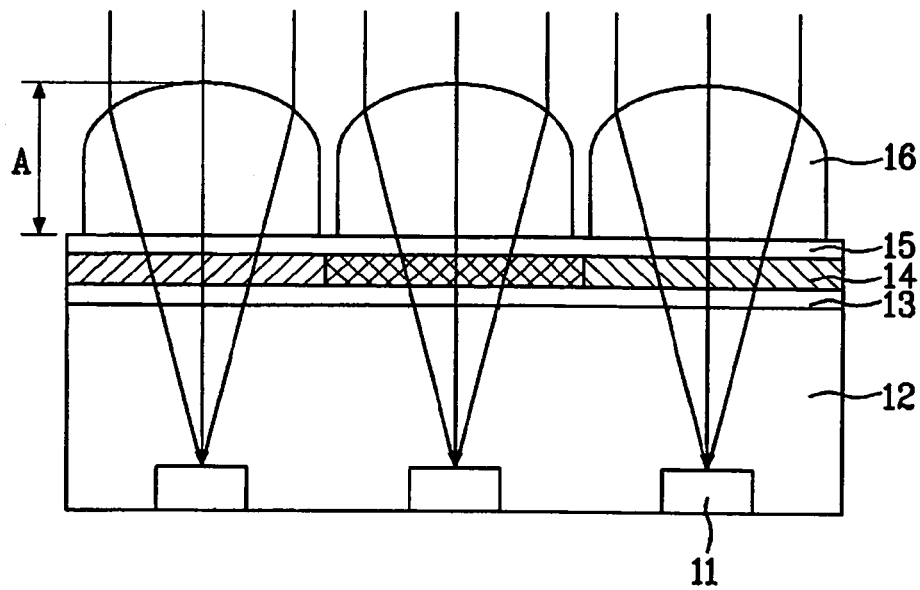
FIG. 1 is a sectional view a related art CMOS image sensor.
Figure 2:
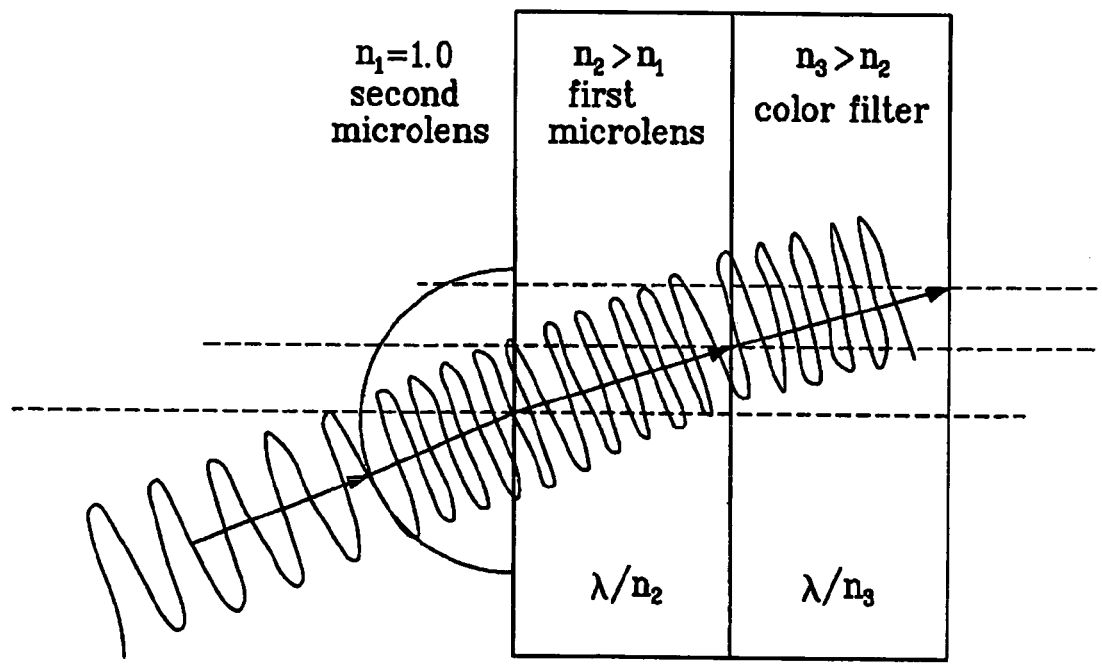
FIG. 2 illustrates a light path depending on a refractive index varied depending on a material.

FIG. 2 illustrates a light path depending on a refractive index varied depending on a material.

As shown in FIG. 2, when multilevel material layers having different refractive indexes are deposited, refraction of beams occurs.

The transmitting angle is reduced when light enters from a portion having a low refractive index to a portion having a high refractive index. Based on this principle, a material layer having a first refractive index smaller than a second refractive index is deposited on a material layer having the second refractive index.

As shown in FIG. 2, a transmitting angle of light is varied in the order of θ1, θ2, and θ3 in case of a second microlens having a first refractive index n1, a first microlens having a second refractive index n2 (n2>n1), and a color filter layer having a third refractive index n3 (n3>n2). This means that more light is concentrated on a central axis.

A CMOS image sensor and a method for fabricating the same based on the above principle will now be described.

Figure 3:
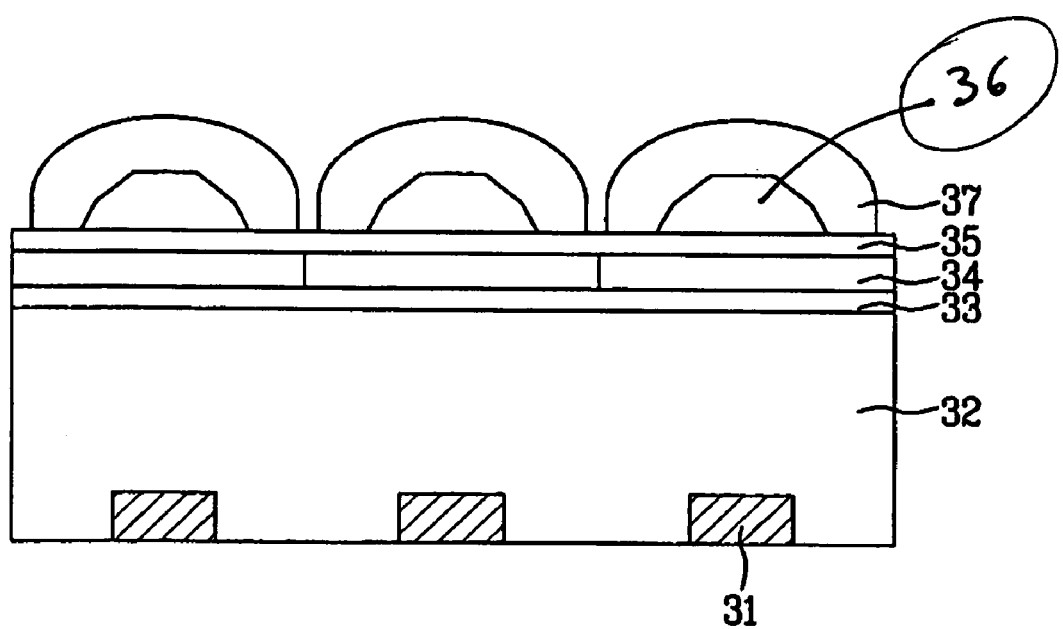
FIG. 3 is a sectional view illustrating a CMOS image sensor according to the present invention.

FIG. 3 is a sectional view illustrating the CMOS image sensor according to the present invention.

As shown in FIG. 3, the CMOS image sensor according to an embodiment of the present invention may include at least one or more photodiodes 31 formed in a semiconductor substrate (not shown) to generate charges in response to incident light, an inter-dielectric layer 32 formed on an entire surface of the semiconductor substrate including the photodiodes 31, a passivation layer 33 formed on the inter-dielectric layer 32, R/G/B color filter layers 34 formed on the passivation layer 33 corresponding to the photodiodes 31 to filter and irradiate light of specific wavelengths, a planarization layer 35 formed on the entire surface of the semiconductor substrate including the color filter layers 34, first microlenses 36 formed on the planarization layer 35 to correspond to the photodiodes 31, and second microlenses 37 surrounding the first microlenses 36 and concentrating light at a refractive index different from that of the first microlenses 36 to irradiate the concentrated light to the photodiodes 31.

Supposing that the color filter layers 34 have a refractive index n3, the first microlenses 36 have a refractive index n2, and the second microlenses 37 have a refractive index n1, the refractive indexes may have sizes in the order of n3>n2>n1.

The second microlenses 37 have a convex semispheric shape, and the first microlenses 36 have a polygonal shape.

Meanwhile, the second microlenses 37 may be formed of photoresist, and the first microlenses 36 may be formed of either photoresist or oxide film such as SiON. The photoresist constituting the first microlenses 36 may be a refractive index greater than that of the photoresist constituting the second microlenses 37.

In the aforementioned CMOS image sensor according to the present invention, the color filter layers 34, the first microlenses 36 and the second microlenses 37 may be deposited at different refractive indexes so that the incident light to the photodiodes 31 may be refracted three times to improve concentration efficiency.

FIG. 4A to FIG. 4D are sectional views illustrating process steps of fabricating the CMOS image sensor according to the present invention.

Figure 4A:
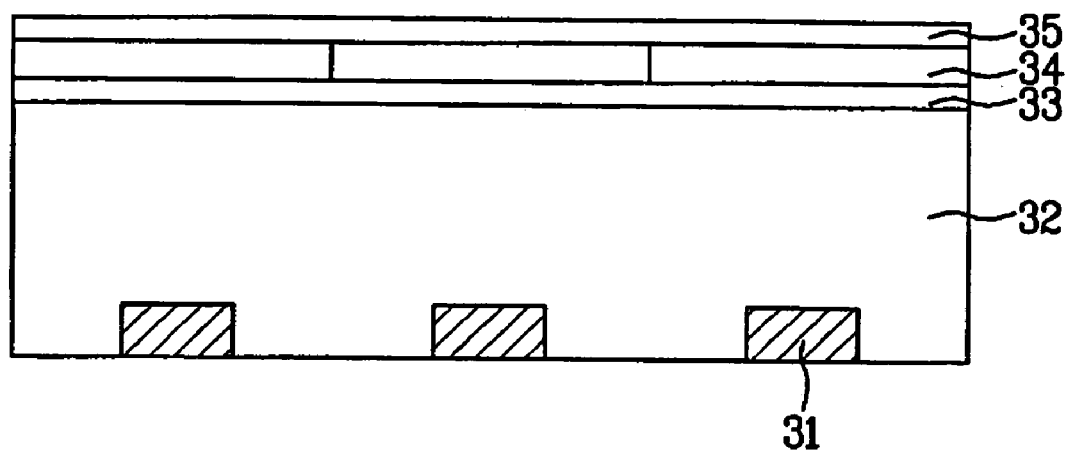
FIG. 4A to FIG. 4D are sectional views illustrating process steps of fabricating a CMOS image sensor according to the present invention.

As shown in FIG. 4A, the inter-dielectric layer 32 is formed on the entire surface of the semiconductor substrate in which the photodiodes 31 generating charges in response to the incident light are formed.

The inter-dielectric layer 32 may be formed in several levels. For example, after a light-shielding layer (not shown) is formed on one inter-dielectric layer to prevent light from entering a portion other than the photodiodes 31, another inter-dielectric layer may be formed on the light-shielding layer.

Subsequently, the passivation layer 33 is formed on the inter-dielectric layer 32 to protect a device from water and scratch.

Next, a salt resist is deposited on the passivation layer 33 and then patterned to form the color filter layers 34 that filter light at respective wavelengths.

A planarization layer 35 is formed on the color filter layers 34 to obtain planarization for focal distance and lens layers.

Figure 4B:
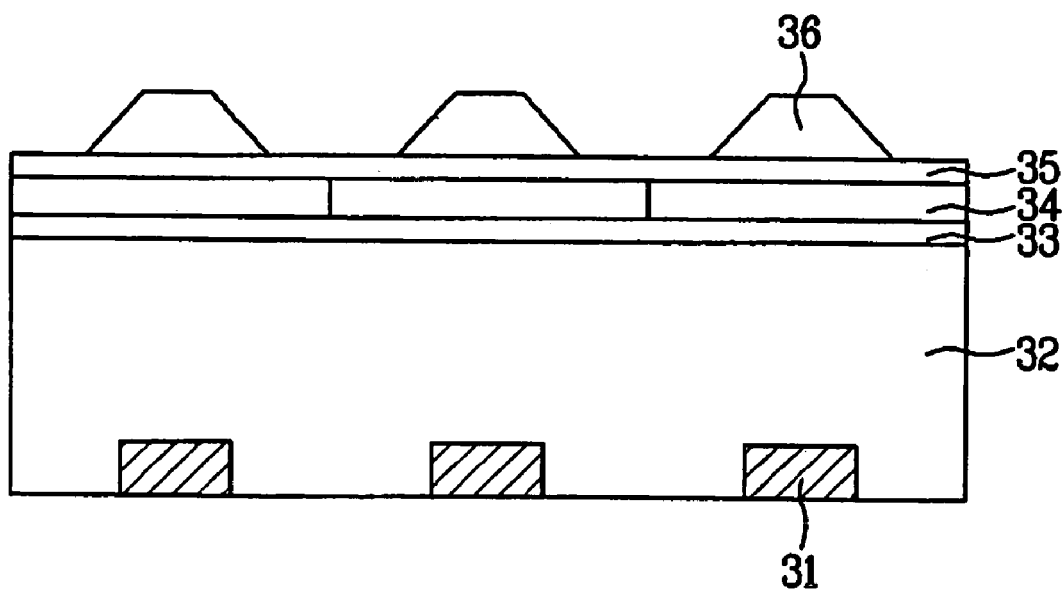

As shown in FIG. 4B, a material layer for lenses is deposited on the planarization layer 35 by using either resist or oxide film such as SiON. The resist or oxide film may have a refractive index smaller than that of the color filter layers 34.

Subsequently, the material layer for lenses is selectively patterned by exposing and developing processes so that the first microlenses 36 having a trapezoidal shape (or a rectangular shape) are formed on the planarization layer 35 to correspond to the photodiodes 31.

The first microlenses 36 having a trapezoidal shape may be formed by adjusting focus of light during the exposing process to selectively pattern the material layer.

Figure 4C:
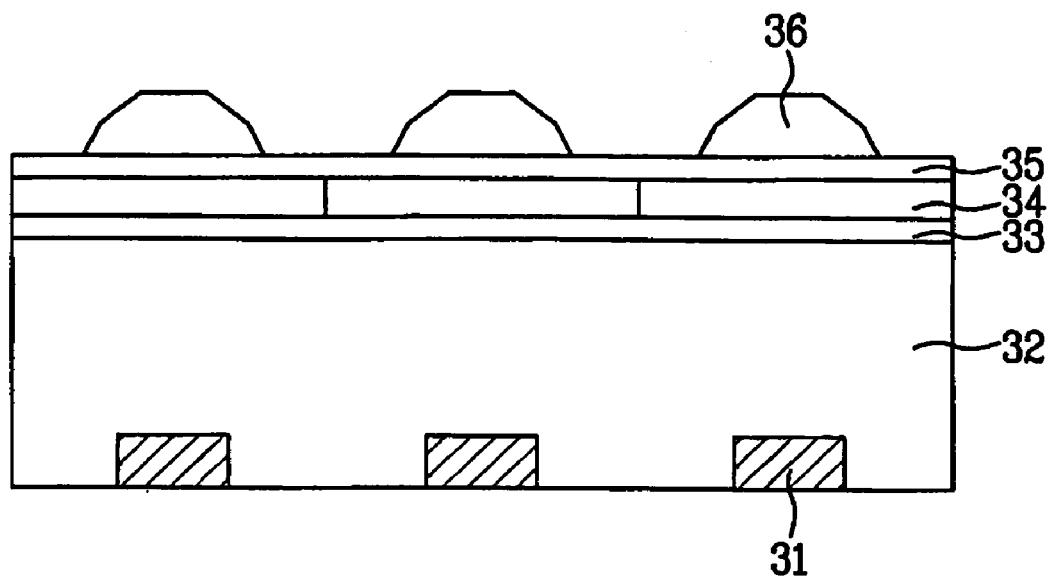

As shown in FIG. 4C, the first microlenses 36 having a trapezoidal shape undergo a reflow process to have a polygonal shape.

Figure 4D:
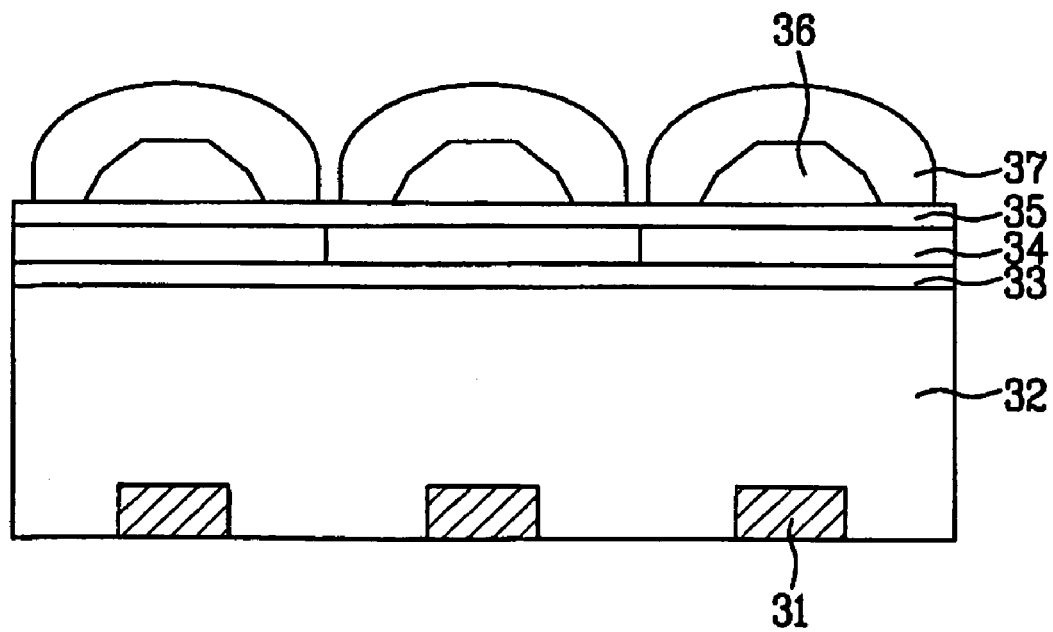

As shown in FIG. 4D, a material layer for lenses is deposited on the entire surface including the first microlenses 36 by using either resist or oxide film having a refractive index different from that of the first microlenses 36.

Subsequently, the second microlenses 37 may be formed by a patterning process and a reflow process to correspond to the photodiodes 31 and surround the first microlenses 36.

The second microlenses 37 may be hardened by irradiating ultraviolet rays. In this case, the second mircolenses 37 can have an optimized curvature radius.

In the aforementioned CMOS image sensor according to an exemplary embodiment of the present invention, supposing that the color filter layers 34 have a refractive index n3, the first microlenses 36 have a refractive index n2, and the second microlenses 37 have a refractive index ni1, the refractive indexes may have sizes in the order of n3>n2>n1.

A transmitting angle is reduced when light enters from a portion having a low refractive index to a portion having a high refractive index.

Therefore, it is possible to improve concentration efficiency of light while the light transmits the second microlenses 37 and the first microlenses 36. Also, it is possible to improve resolution of the color filter layers 34.

Furthermore, if rework is required due to any problem after the reflow process for formation of the microlenses, the processes prior to the process of forming the microlenses are not required because the microlenses are formed of a multilevel structure. In this case, the rework is simplified and the cost can be reduced.

In the process of forming the microlenses according to an exemplary embodiment of the present invention, a material such as SiON having a refractive index greater than that of photoresist for the semishperical microlenses is deposited after the color filter layers and the planarizaton layer are formed. Thus, the polygonal microlenses may be formed before the semispherical microlenses are formed.

The first and second microlenses may be formed by using both oxide film and photoresist. Alternatively, the first and second microlenses may be formed by using either oxide film having different refractive indexes or photoresist having different refractive indexes.

As described above, the CMOS image sensor and the method for fabricating the same according to an exemplary embodiment of the present invention have the following advantages.

First, since the microlenses may be formed to have a multilevel structure by using materials having different refractive indexes, it is possible to improve condensing efficiency of the light in comparison with a single microlens structure.

Second, most of the light passing through the color filter layers enters the photodiodes due to improved concentration efficiency of the light. In this case, the color filter layers can obtain clearer resolution.

Finally, since the microlenses have a multilevel structure, the processes prior to the process of forming the microlenses are not required during the rework. In this case, the rework is simplified and the cost can be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a CMOS image sensor comprising:

forming an inter-dielectric layer on an entire surface of a semiconductor substrate in which a plurality of photodiodes are formed;

forming color filter layers on the inter-dielectric layer with a predetermined distance therebetween;

forming first microlenses having a first refractive index over the color filter layers to correspond to the photodiodes; and forming second microlenses having a second refractive index on the first microlenses in such a way that the second microlenses surround the first microlenses, wherein the color filter layers are formed of a material having a refractive index greater than the first refractive index and greater than the second refractive index.

2. The method according to claim 1, wherein the first refractive index is different from the second refractive index.

3. The method according to claim 1, further comprising forming a planarization layer on the entire surface of the semiconductor substrate including the color filter layers before forming the first microlenses.

4. The method according to claim 1, wherein the first microlenses are formed of oxide film.

5. The method according to claim 1, wherein the second microlenses are formed of photoresist.

6. The method according to claim 1, wherein the first microlenses and the second microlenses are formed of photoresist or oxide film having different refractive indexes.

7. The method according to claim 1, wherein the first microlenses are formed of a material having a refractive index greater than that of the second microlenses.

8. The method according to claim 3, wherein the step of forming the first microlenses includes:

depositing a material layer for lenses on the planarization layer;

selectively patterning the material layer to form first microlens patterns in such a way that the first microlens patterns have a trapezoidal shape; and reflowing the first microlens patterns to form the first microlenses having a polygonal shape.

9. The method according to claim 8, wherein the first microlens patterns having trapezoidal shape are formed by adjusting focus of light when an exposure process is performed to selectively pattern the material layer.

10. The method according to claim 1, wherein the step of forming the second microlenses includes:

depositing a material layer for lenses on an entire surface of the semiconductor substrate including the first microlenses;

selectively patterning the material layer for lenses; and reflowing the material layer for lenses to form the second microlenses having a convex semispherical shape.

* * * * *